(12) United States Patent
Tanaka et al.

(10) Patent No.: US 7,936,036 B2
(45) Date of Patent: May 3, 2011

(54) SOLID-STATE IMAGE SENSOR WITH TWO DIFFERENT TRENCH ISOLATION IMPLANTS

(75) Inventors: Shouzi Tanaka, Nara (JP); Ryohei Miyagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/434,474

(22) Filed: May 1, 2009

(65) Prior Publication Data

US 2009/0278181 A1    Nov. 12, 2009

(30) Foreign Application Priority Data

May 12, 2008 (JP) ................................ 2008-125087

(51) Int. Cl.
*H01L 31/112* (2006.01)
(52) U.S. Cl. ............... 257/446; 257/292; 257/E27.132
(58) Field of Classification Search .......... 257/291, 257/292, 443–446, 452, E27.132, E27.133, 257/E21.334, E31.079
See application file for complete search history.

(56) References Cited

U.S. PATENT DOCUMENTS

2004/0178430 A1    9/2004 Rhodes et al.
2006/0131624 A1*   6/2006 Katsuno et al. ............... 257/292
2007/0057147 A1    3/2007 Kim
2007/0221973 A1    9/2007 Nagasaki et al.

FOREIGN PATENT DOCUMENTS

JP    2006-521697    9/2006

* cited by examiner

*Primary Examiner* — Evan Pert
*Assistant Examiner* — Selim Ahmed
(74) *Attorney, Agent, or Firm* — McDermott Will & Emery LLP

(57) ABSTRACT

A solid-state image sensor includes: a trench isolation region; a photodiode region for converting incident light to signal charges and accumulating the signal charges therein; a floating diffusion region for accumulating the signal charges of the photodiode region; a gate electrode formed over the element formation region located between the photodiode region and the floating diffusion region, and formed so that both ends of the gate electrode respectively overlap a part of the photodiode region and a part of the floating diffusion region; and an inactive layer formed in a region located in a bottom portion and sidewall portions of the trench isolation region. An impurity concentration in a region located under the gate electrode in the inactive layer is lower than that in a region other than the region located under the gate electrode in the inactive layer.

12 Claims, 15 Drawing Sheets

SOLID-STATE IMAGE SENSOR WITH TWO DIFFERENT TRENCH ISOLATION IMPLANTS

CROSS-REFERENCE TO RELATED APPLICATIONS

This application claims priority under 35 U.S.C. §119(a) based on Japanese Patent Application No. 2008-125087 filed on May 12, 2008, the entire contents of which are hereby incorporated by reference.

BACKGROUND

A technique disclosed in the present invention relates to a solid-state image sensor in which a plurality of photoelectric conversion portions are arranged in an array, and a manufacturing method thereof.

With a recent growing demand for a higher pixel count and a smaller size of solid-state image sensors, a higher image quality has also been required for the solid-state image sensors. It is therefore necessary to reduce the pixel size and to suppress noise.

One of the most popular types of conventional solid-state image sensors is CMOS (complementary metal oxide semiconductor) solid-state image sensors, that is, CMOS sensors. In a circuit of a CMOS sensor, a plurality of photoelectric conversion portions are arranged in an array, and each pixel cell accumulates charges optically generated in the substrate. Each pixel cell therefore includes a photodiode, a photogate, or a photoconductor which covers a doped region of the substrate. Moreover, a read circuit is connected to each pixel cell. The read circuit includes a charge transfer portion which is formed on the substrate at a position adjacent to the photodiode, the photogate, or the photoconductor having a sense node. The sense node is typically a floating diffusion node, and is connected to a gate of a source follower output transistor. Moreover, the CMOS sensor includes at least one transfer transistor for transferring charges from a charge accumulating region of the substrate to the floating diffusion node, and may further include a reset transistor for resetting the diffusion node to a predetermined charge level before charge transfer.

In the conventional solid-state image sensor having the above structure performs the following processes by active elements of the pixel cells: (1) conversion from photons to charges; (2) accumulation of image charges; (3) charge transfer to the floating diffusion node; (4) resetting the floating diffusion node to a known state before charge transfer to the floating diffusion node; (5) pixel selection for reading; and (6) output and amplification of a signal representing charges. The charges transferred to the floating diffusion node are converted to a pixel output voltage by the source follower output transistor. Note that, typically, photosensitive elements of the pixels of the solid-state image sensor are either depleted p-n junction photodiodes, or electric-field induced depletion regions under the photogates.

FIG. 14 is a structural diagram of a conventional solid-state image sensor. More specifically, FIG. 14 is a schematic plan view of a CMOS image sensor 100 which has 1-pixel, 4-transistor (4T) type pixel cells having a typical structure.

As shown in FIG. 14, a photodiode region 131 serving as a charge accumulating region is formed in a surface region of a not-shown substrate. The substrate is made of, for example, silicon. A floating diffusion region (sense node) 137 is formed adjacent to the photodiode region 131. A transfer gate 125 of a transfer transistor is formed over the substrate so as to extend over the photodiode region 131 and the floating diffusion region 137. The transfer gate 125 transfers photoelectric charges generated in the photodiode region 131 to the floating diffusion region 137.

A gate 134 of a reset transistor, a gate 135 of a source follower transistor, and a gate 136 of a row select access transistor are further formed over the not-shown substrate. The floating diffusion region 137 is connected to the gate 135 of the source follower transistor. The source follower transistor supplies an output signal to the row select access transistor. The gate 136 of the row select access transistor selectively gates an output signal to a contact 132 which is formed in a source/drain region 133 doped with impurities having n-type conductivity. The reset transistor resets the floating diffusion region 137 to a predetermined charge level before each charge transfer from the photodiode 131. Note that contacts 132 are formed in a not-shown insulating layer to connect to the respective gates and other connection lines in the CMOS sensor. Therefore, the contacts 132 implement electric connection to, for example, the source/drain region 133, the floating diffusion region 137, and other interconnects.

FIGS. 15A and 15B are schematic cross-sectional views showing a main part of the solid-state image sensor shown in FIG. 14. FIG. 15A shows a cross section corresponding to line XVa-XVa in FIG. 14, and FIG. 15B shows a cross section corresponding to line XVb-XVb in FIG. 14.

In the cross section of FIG. 15A, the photodiode 131 is formed in an element formation region in a p-type region 110 formed on the not-shown substrate. In other words, the photodiode 131 is formed in a region surrounded by a trench isolation region 119. The trench isolation region 119 is formed by filling a trench 119a with a dielectric material, and serves as an element isolation region. The photodiode 131 is formed by a photosensitive region, that is, a p-n-p junction region formed by a p-type region 127, an n-type region 121, and the p-type region 110. Since the photodiode 131 includes two p-type regions 127, 110, the n-type region 121 is completely depleted at a pinning voltage. The floating diffusion region 137 is formed in a surface region of the p-type region 110 so as to be adjacent to the n-type region 121. An n-type control implantation layer 123 adjacent to the n-type region 121 and the floating diffusion region 137 is also formed in the surface region of the p-type region 110. The transfer gate 125 is formed on the surface region of the p-type region 110 with a gate insulating film 124 interposed therebetween so as to extend over the photodiode region 131, the floating diffusion region 137, and the control implantation layer 123. Sidewalls 130 are formed on the sidewalls of the transfer gate 125.

In the cross section of FIG. 15B, on the other hand, the control implantation layer 123 is formed in the surface region of the p-type region 110 surrounded by the trench isolation region 119. The transfer gate 125 is formed on the surface region of the p-type region 110 with the gate insulating film 124 interposed therebetween so as to cover the control implantation layer 123. The transfer gate 125 is formed so that both ends of the transfer gate 125 are located on the trench isolation region 119.

In the conventional CMOS image sensor having the above structure, incident light causes electrons to gather in the n-type region 121. A maximum output signal, which is generated by the source follower transistor having the gate 135, is proportional to the number of electrons to be discharged from the n-type region 121. The maximum output signal increases with increase in electron capacitance or acceptability of the n-type region 121 for acquiring electrons. The electron capacitance of the photodiode 131 typically depends on the doping level of the image sensor and the impurities which are implanted into an active layer.

The trench isolation region 119, which is provided as a physical barrier for insulating adjacent pixel cells from each other, is formed by a typical STI (Shallow Trench Isolation) method by first forming a trench 119a in the substrate by etching, then filling the trench 119a with a dielectric material such as silicon dioxide ($SiO_2$) by a CVD (Chemical Vapor Deposition) method, and planarizing the surface.

A problem in the formation of the trench isolation region 119 having the above structure is that, when ions are implanted into a region close to the ends or the sidewall portions of the trench 119a, a leakage current is generated in a junction region between the element formation region and the trench isolation region 119. Moreover, a dominant crystal face along the sidewalls of the trench isolation region 119 has a higher silicon density than that of the adjacent substrate. Therefore, a high density of trap sites is produced along the sidewalls of the trench isolation region 119. These trap sites are normally uncharged, but are charged when electrons and holes are trapped in the trap sites. These trapped carriers add charges to the device, and contribute to fixed charges of the device, whereby the threshold voltage of the device changes. When the trap sites are formed along the sidewalls of the trench isolation region 119, current generation along and near the trench sidewalls becomes very high. The current generated from the trap sites inside or near the photodiode deletion region causes a dark current.

In manufacturing of CMOS image sensors, it is important to implement a structure which minimizes a dark current in the photodiode. The dark current is generally caused by leakage in the charge accumulating region of the photodiode 131, which is strongly dependent on the impurity profile of the CMOS image sensor. Moreover, as described above, defects and trap sites inside or near the depletion region of the photodiode strongly affect the magnitude of the dark current generated. In other words, the dark current is generated by a current generated from the trap sites inside or near the depletion region of the photodiode, generation of band-to-band tunneling induced carriers due to high electric fields in the depletion region, junction leakage generated from the sidewalls of the photodiode, and leakage from a junction region of the trench isolation region 119, such as stress induced and trap assisted tunneling.

In the above conventional CMOS image sensor, an inactive layer 117 is formed to suppress generation of the dark current. As shown in FIGS. 15A and 15B, the inactive layer 117 is formed by implanting impurities into the bottom and sidewall portions of the trench 119a before the trench 119a is filled with the dielectric material. The impurities implanted in the bottom and sidewall portions of the trench 119a have an opposite conductivity type to that of impurities implanted in the charge accumulating region of the photodiode 131 (see, e.g., Published Japanese Translation of PCT International Application No. 2006-521697).

SUMMARY

As described above, reduction in pixel-cell size has been increasingly required with increase in pixel count and reduction in size of MOS image sensors. Reducing the size of CMOS image sensors requires reduction in gate width of the transfer gate 25. In the structure of the conventional CMOS image sensor 100, the control implantation layer 123 for controlling a threshold voltage Vt of the transfer transistor is surrounded by the inactive layer 117 as a p-type region. Due to the inactive layer 117 formed in the sidewall portions of the trench 119a, the threshold voltage of the transfer transistor is increased by a narrow channel effect, which makes it difficult to transfer all the charges accumulated in the n-type region 121 to the floating diffusion region 137. If the CMOS image sensor is unable to completely collect charges in the n-type region 121 and transfer the collected charges, the CMOS image sensor has a poor S/N (signal to noise) ratio and a poor dynamic range. In this case, not only the number of saturation electrons (signal) decreases, but also residual charges in the n-type region 121 increases noise due to quantum fluctuation in a low illumination condition, thereby significantly degrading the image quality.

The structure of another conventional CMOS image sensor used to implement the above-described reduction in size is shown in FIGS. 16A and 16B. As shown in FIG. 16A, in the structure of this CMOS image sensor, the area of a photodiode region 131 for collecting and accumulating charges therein is increased, and junction capacitance is reduced so as to increase the sensitivity of a floating diffusion region 137. In this structure, however, a transfer gate 125a has a narrower gate width as shown in FIG. 16B, and therefore, the above-described problems due to the narrow channel effect further tend to occur. These problems associated with reduction in cell size become obvious especially when the transfer gate width, which serves as a charge transfer path from the photodiode region 131 (the charge accumulating region) to the floating diffusion region 137, becomes narrower than, for example, 0.5 μm, and the width of an implantation region of an inactive layer 117 becomes larger than 0.25 μm. This is because the inactive layers 117 facing each other directly increase a threshold voltage of a transfer transistor and the increased threshold voltage serves as a barrier against charge transfer.

In view of the above, the present invention provides a solid-state image sensor having a structure capable of suppressing dark current generation around a photodiode region, and a manufacturing method thereof. As a result, the present invention provides a solid-state image sensor having a structure capable of suppressing the narrow channel effect and preventing increase in threshold voltage, and a manufacturing method thereof.

Example means of the present invention will be described specifically below.

A solid-state image sensor includes: a trench isolation region formed in a semiconductor substrate, and defining an element formation region; a photodiode region formed in the element formation region, for converting incident light to signal charges and accumulating the signal charges therein; a floating diffusion region formed in the element formation region, for accumulating the signal charges of the photodiode region; a gate electrode formed over the element formation region located between the photodiode region and the floating diffusion region, and formed so that both ends of the gate electrode respectively overlap a part of the photodiode region and a part of the floating diffusion region; and an inactive layer formed in a region located in a bottom portion and sidewall portions of the trench isolation region in the semiconductor substrate. An impurity concentration in a region located under the gate electrode in the inactive layer is lower than that in a region other than the region located under the gate electrode in the inactive layer.

In the solid-state image sensor, the region other than the region located under the gate electrode in the inactive layer may include a region near the photodiode region in the inactive layer.

In the solid-state image sensor, in the region located in the sidewall portions of the trench isolation region in the inactive layer, an impurity concentration in an upper part close to a surface side of the semiconductor substrate may be higher than that in a lower part close to the bottom portion of the trench isolation region.

In the solid-state image sensor, a first width in a gate width direction of the photodiode region located under one end of the gate electrode may be smaller than a second width in a longitudinal direction in a middle of the photodiode region.

In the solid-state image sensor, the photodiode region may be formed by a p-n-p junction region, and the p-n-p junction region may be formed by a first p-type region formed in the element formation region, an n-type region formed on the first p-type region, and a second p-type region formed on the n-type region.

In the solid-state image sensor, a gate width direction of the gate electrode may be parallel to a longitudinal direction of the photodiode region.

In the solid-state image sensor, a gate width direction of the gate electrode may be tilted with respect to a longitudinal direction of the photodiode region.

In the solid-state image sensor, the gate width direction of the gate electrode may be tilted at 45° with respect to the longitudinal direction of the photodiode region.

A manufacturing method of a solid-state image sensor includes the steps of: (a) forming a trench which defines an element formation region in a semiconductor substrate; (b) by using a first resist pattern which exposes a region defining a first region of the element formation region in a region where the trench is formed, performing a first ion implantation to form a first inactive layer in the region defining the first region in the region where the trench is formed; (c) by using a second resist pattern which exposes a region defining a second region of the element formation region in the region where the trench is formed, performing a second ion implantation to form a second inactive layer in the region defining the second region in the region where the trench is formed; (d) after the steps (b) and (c), forming, in the second region, a photodiode region for converting incident light to signal charges and accumulating the signal charges therein; (e) forming a gate electrode over the first region so that the gate electrode overlaps a part of the photodiode region; and (f) forming a floating diffusion region in the element formation region so that the floating diffusion region faces the photodiode region with the gate electrode interposed therebetween. A dose of impurities in the first ion implantation is smaller than that of impurities in the second ion implantation.

In this manufacturing method, the first resist pattern in the step (b) may expose only the region defining the first region of the element formation region in the region where the trench is formed, and cover the first region.

Another manufacturing method of a solid-state image sensor includes the steps of: (a) forming a trench which defines an element formation region in a semiconductor substrate; (b) performing ion implantations of impurities at a single dose respectively from first to fourth directions which are different from each other, thereby forming an inactive layer in a bottom portion and sidewall portions of the trench; (c) after the step (b), forming, in the element formation region, a photodiode region for converting incident light to signal charges and accommodating the signal charges therein; (d) forming a gate electrode over the element formation region so that the gate electrode overlaps a part of the photodiode region; and (e) forming a floating diffusion region in the element formation region so that the floating diffusion region faces the photodiode region with the gate electrode interposed therebetween. A gate width direction of the gate electrode is tilted with respect to a longitudinal direction of the photodiode region.

Two of the first to fourth directions are one direction and the other direction of the gate width direction of the gate electrode, and the other two of the first to fourth directions are one direction and the other direction of a gate length direction of the gate electrode.

In this manufacturing method, the gate width direction of the gate electrode may be tilted at 45° with respect to the longitudinal direction of the photodiode region.

According to the above example means, as a structure of the inactive layer formed in the bottom and sidewall portions of the trench isolation region, the impurity concentration of the inactive layer in the region under the gate electrode is lower than that of the inactive layer in the remaining region. This structure prevents increase in threshold voltage of a transfer transistor due to a narrow channel effect, and implements a lower threshold voltage of the transfer transistor, whereby transfer characteristics can be improved. As a result, a high image quality solid-state image sensor having a sufficiently large number of saturation electrons and capable of suppressing noise is implemented. Moreover, since the inactive layer is formed, generation of a dark current and a leakage current around the photodiode region can be suppressed to a low level. Especially when the gate width of the gate electrode of the transfer transistor becomes 0.5 μm or less as a result of reduction in size of the solid-state image sensor, reducing the width of an impurity implantation region of the inactive layer under the gate electrode to 0.25 μm or less is more effective because impurities of the inactive layer do not directly increase the threshold voltage of the transfer transistor.

BRIEF DESCRIPTION OF THE DRAWINGS

FIG. 2A shows a cross section corresponding to line IIa-IIa in FIG. 1, FIG. 2B shows a cross section corresponding to line IIb-IIb in FIG. 1, and FIG. 2C shows a cross section corresponding to line IIc-IIc in FIG. 1.

FIG. 9A shows a cross section corresponding to line IXa-IXa in FIG. 8, and FIG. 9B shows a cross section corresponding to line IXb-IXb in FIG. 8.

FIG. 15A shows a cross section corresponding to line XVa-XVa in FIG. 14, and FIG. 15B shows a cross section corresponding to line XVb-XVb in FIG. 14.

DETAILED DESCRIPTION

First Embodiment

Figure 1:
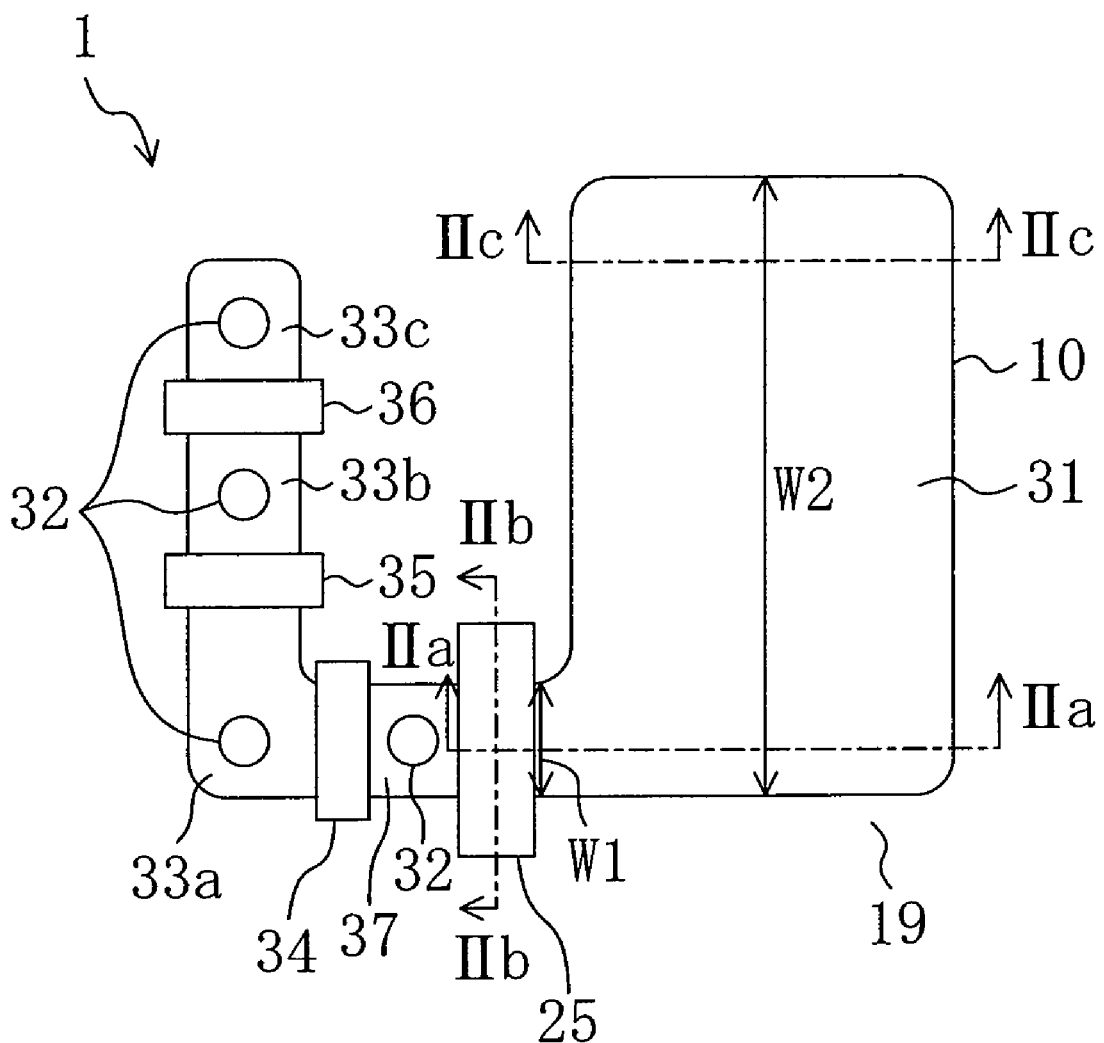
FIG. 1 is a structural diagram of a first example solid-state image sensor, and more specifically, is a schematic plan view of a main part of a CMOS image sensor having 1 pixel, 4-transistor (4T) type pixel cells.

FIG. 1 is a structural diagram of a first example solid-state image sensor. More specifically, FIG. 1 is a schematic plan view of a main part of a CMOS image sensor 1 having 1-pixel, 4-transistor (4T) type pixel cells.

As shown in FIG. 1, the first example CMOS image sensor 1 has a trench isolation region 19, a photodiode region 31, an n-type floating diffusion region (sense node) 37, and a gate electrode 25. The trench isolation region 19 is formed in a semiconductor substrate (hereinafter, referred to as the "substrate") 10 made of silicon. The photodiode region 31 is formed in an element formation region of the substrate 10 which is defined by the trench isolation region 19. The photodiode region 31 serves as a charge accumulating region for converting incident light to signal charges and accumulating the signal charges therein. The n-type floating diffusion region 37 is formed in the element formation region, and accumulates the signal charges of the photodiode region 31. The gate electrode 25 is formed over the element formation region located between the photodiode region 31 and the floating diffusion region 37. The gate electrode 25 is formed so that both ends of the gate electrode 25 respectively overlap a part of the photodiode region 31 and a part of the floating diffusion region 37. A transfer transistor is formed by the gate electrode 25, the photodiode region 31, and the floating diffusion region 37. The gate electrode 25 transfers signal charges generated in the charge accumulating region of the photodiode region 31 to the floating diffusion region 37. A first width W1 in the gate width direction of the photodiode region 31 located under one end of the gate electrode 25 is smaller than a second width W2 in the longitudinal direction in the middle of the photodiode region 31. The gate width direction of the gate electrode 25 is parallel to the longitudinal direction of the photodiode region 31.

A reset transistor having a gate electrode 34, a source follower transistor having a gate electrode 35, and a row select access transistor having a gate electrode 36 are formed in the element formation region. The reset transistor is formed by the floating diffusion region 37, the gate electrode 34, and an n-type source/drain region 33a. The gate electrode 34 is formed over the element formation region, and is positioned on the opposite side to the gate electrode 25 with respect to the floating diffusion region 37. The n-type source/drain region 33a is formed in the element formation region, and is positioned on the opposite side to the floating diffusion region 37 with respect to the gate electrode 34. The source follower transistor is formed by the source/drain region 33a, the gate electrode 35, and an n-type source/drain region 33b. The gate electrode 35 is formed over the element formation region, and is positioned on the opposite side to the gate electrode 34 with respect to the source/drain region 33a. The n-type source/drain region 33b is formed in the element formation region, and is positioned on the opposite side to the source/drain region 33a with respect to the gate electrode 35. The row select access transistor is formed by the source/drain region 33b, the gate electrode 36, and an n-type source/drain region 33c. The gate electrode 36 is formed over the element formation region, and is positioned on the opposite side to the gate electrode 35 with respect to the source/drain region 33b. The n-type source/drain region 33c is formed in the element formation region, and is positioned on the opposite side to the source/drain region 33b with respect to the gate electrode 36.

The floating diffusion region 37 is connected to the gate electrode 35 of the source follower transistor. The source follower transistor supplies an output signal to the row select access transistor. The gate electrode 36 of the row select access transistor selectively gates an output signal to a contact 32 formed in the source/drain region 33b. The reset transistor resets the floating diffusion region 37 to a predetermined charge level before each charge transfer from the photodiode region 31. Note that contacts 32 are formed in a not-shown insulating film to connect to the respective gate electrodes and other connection lines in the CMOS image sensor. Therefore, the contacts 32 implement electric connection to, for example, the source/drain regions 33a, 33b, 33c, the floating diffusion region 37, and other interconnects.

Figure 2A:
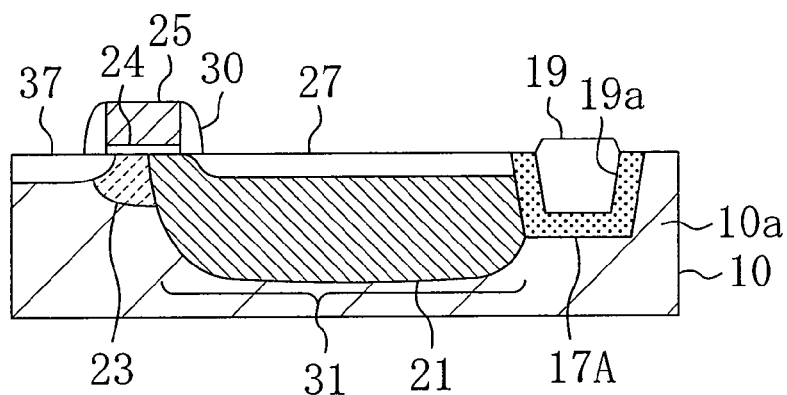
FIGS. 2A, 2B, and 2C are schematic cross-sectional views of a pixel cell shown in FIG. 1, where
Figure 2B:
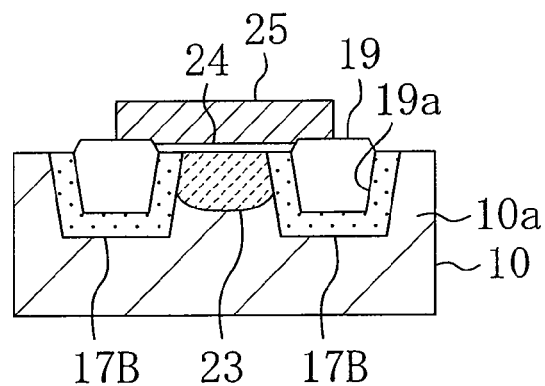
Figure 2C:
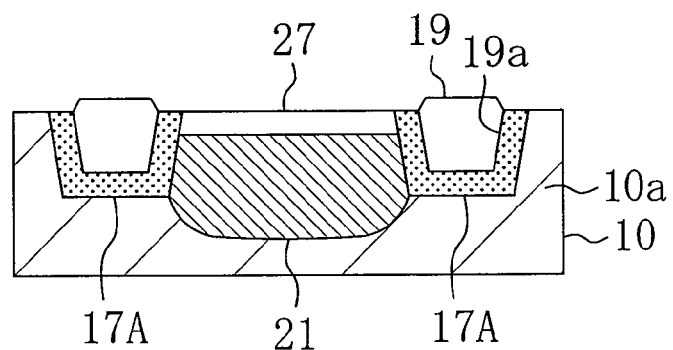

FIGS. 2A through 2C are schematic cross-sectional views of the main part of the CMOS image sensor 1 shown in FIG. 1. FIG. 2A shows a cross section corresponding to line IIa-IIa in FIG. 1. FIG. 2B shows a cross section corresponding to line IIb-IIb in FIG. 1. FIG. 2C shows a cross section corresponding to line IIc-IIc in FIG. 1.

In the cross section of FIG. 2A, the photodiode region 31, a p-type control implantation layer 23, and the n-type floating diffusion region 37 are formed in the element formation region in a p-type region 10a of the silicon substrate 10. In other words, the photodiode region 31, the p-type control implantation layer 23, and the n-type floating diffusion region 37 are formed in a region surrounded by a trench isolation region 19. The trench isolation region 19 is formed by filling a trench 19a with a dielectric material such as silicon dioxide ($SiO_2$) by a CVD method, and serves as an element isolation region. The photodiode region 31 is formed by a photosensitive region formed in the substrate 10, that is, a p-n-p junction region. The p-n-p junction region is formed by the p-type region 10a, an n-type region 21 formed on the p-type region 10a, and a p-type region 27 formed on the n-type region 21. Since the photodiode region 31 includes two p-type regions 27, 10a, the n-type region 21 becomes a depletion region which is completely depleted at a pinning voltage. The n-type region 21 and the floating diffusion region 37 are formed with the control implantation region 23 interposed therebetween in a surface region of the element formation region of the substrate 10. The gate electrode 25 is formed over the element formation region of the substrate 10 with a gate insulating film 24 interposed therebetween. The gate electrode 25 extends over the control implantation layer 23 so that both ends of the gate electrode 25 respectively overlap a part of the n-type region 21 in the photodiode region 31 and a part of the floating diffusion region 37. Sidewalls 30 are formed on the sidewalls of the gate electrode 25. The trench isolation region 19 is formed by an STI method. The depth of the trench 19a is 100 nm to 350 nm, and preferably, 250 nm. The width of the trench 19a is 50 nm to 500 nm, and more preferably, 150 nm. In order to suppress dark current generation, a p-type inactive layer 17A is formed in the bottom and sidewall portions of the trench isolation region 19 in the region other than the region located under the gate electrode 25 in the substrate 10. The p-type inactive layer 17A has a thickness (diffusion layer width) of 10 nm to 250 nm (preferably, 120 nm), a peak concentration of $5.0\times10^{16}$ to $5.0\times10^{18}$ cm$^{-3}$ (preferably, $3.0\times10^{17}$ cm$^{-3}$). Note that impurities having an opposite conductivity type to that of impurities for forming the depletion region (n-type region 21) of the photodiode region 31, that is, p-type impurities, can be implanted when forming the inactive layer 17A.

In the cross section of FIG. 2B, the control implantation layer 23 is formed in the surface region of the element formation region surrounded by the trench isolation region 19 in the p-type region 10a of the substrate 10. The gate electrode 25 is formed over the surface region of the element formation region with the gate insulating film 24 interposed therebetween, so as to cover the control implantation layer 23. The gate electrode 25 is formed so that both ends of the gate electrode 25 in the gate width direction are positioned on the trench isolation region 19. In order to suppress dark current generation, a p-type inactive layer 17B is formed in the bottom and sidewall portions of the trench isolation region 19 located under the gate electrode 25 in the substrate 10. The p-type inactive layer 17B has a thickness (diffusion layer width) of 10 nm to 250 nm (preferably, 120 nm), a peak concentration of $1.0\times10^{16}$ to $4.5\times10^{18}$ cm$^{-3}$ (preferably, $1.0\times10^{17}$ cm$^{-3}$). Note that, like the inactive layer 17A, impurities having an opposite conductivity type to that of impurities for forming the depletion region (n-type region 21) of the photodiode region 31, that is, p-type impurities, can be implanted when forming the inactive layer 17B. The impurity concentration of the inactive layer 17B formed in the region located under the gate electrode 25 is made lower than that of the inactive layer 17A formed in the region other than the region located under the gate electrode 25.

In the cross section of FIG. 2C, the n-type region 21 is formed in the element isolation region surrounded by the trench isolation region 19 in the substrate 10. The p-type region 27 is formed in an upper part of the n-type region 21. In order to suppress dark current generation, a p-type inactive layer 17A is formed in the bottom and sidewall portions of the trench isolation region 19 in the region other than the region located under the gate electrode 25 in the substrate 10, as in the structure of FIG. 2A. The p-type inactive layer 17A has a thickness (diffusion layer width) of 10 nm to 250 nm (preferably, 120 nm), a peak concentration of $5.0\times10^{16}$ to $5.0\times10^{18}$ cm$^{-3}$ (preferably, $3.0\times10^{17}$ cm$^{-3}$).

In the CMOS image sensor cell 1 having the above structure, incident light causes electrons to gather in the n-type region 21. A maximum output signal, which is generated by the source follower transistor having the gate electrode 35, is proportional to the number of electrons to be discharged from the n-type region 21. The maximum output signal increases with increase in electron capacitance or acceptability of the n-type region 21 for acquiring electrons. The electron capacitance of the photodiode region 31 typically depends on the doping level of the image sensor and the impurities which are implanted into an active layer.

According to the first example CMOS image sensor 1, as a structure of the inactive layers 17A, 17B formed in the bottom and sidewall portions of the trench isolation region 19, the peak concentration of the inactive layer 17B in the region under the gate electrode 25 is lower than that of the inactive layer 17A in the remaining region. As compared to the case where the inactive layer 17A is formed in the entire region including the region under the gate electrode 25, the above structure prevents increase in threshold voltage of the transfer transistor due to the narrow channel effect, and implements a lower threshold voltage of the transfer transistor, whereby transfer characteristics can be improved. As a result, a high image quality solid-state image sensor having a sufficiently large number of saturation electrons and capable of suppressing noise is implemented. Moreover, since the inactive layers 17A, 17B are formed, generation of a dark current and a leakage current around the photodiode region 31 can be suppressed to a low level.

In the present embodiment, as shown in FIG. 2B, the inactive regions 17B and the control implantation layer 23 are formed in the region between the trench isolation regions 19 under the gate electrode 25. When the width of the element isolation region under the gate electrode 25 is smaller than 500 nm, however, the inactive layers 17B facing each other may be formed adjacent to each other without forming the control implantation layer 23, so that the inactive layers 17B serve also as the control implantation layer 23.

A manufacturing method of the first example solid-state image sensor, and more specifically, a manufacturing method of the above CMOS image sensor 1 shown in FIG. 1 and FIGS. 2A through 2C, will now be described.

Figure 3A:
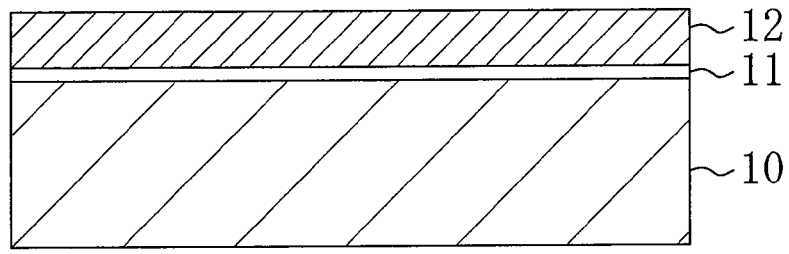
FIGS. 3A, 3B, and 3C are schematic cross-sectional views of a main part of the first example CMOS image sensor, illustrating a manufacturing method of the first example CMOS image sensor.
Figure 3B:
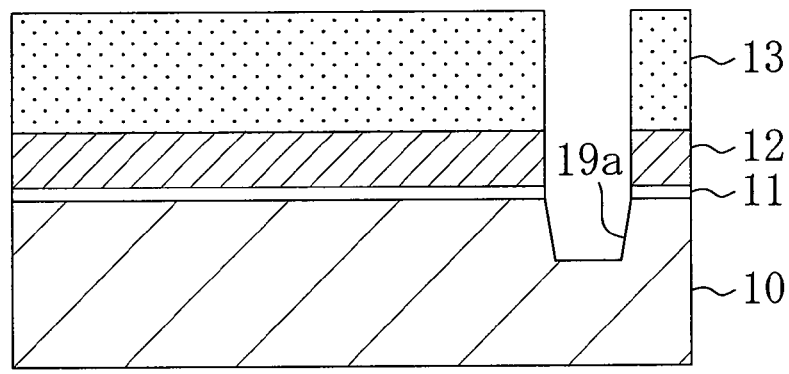
Figure 3C:
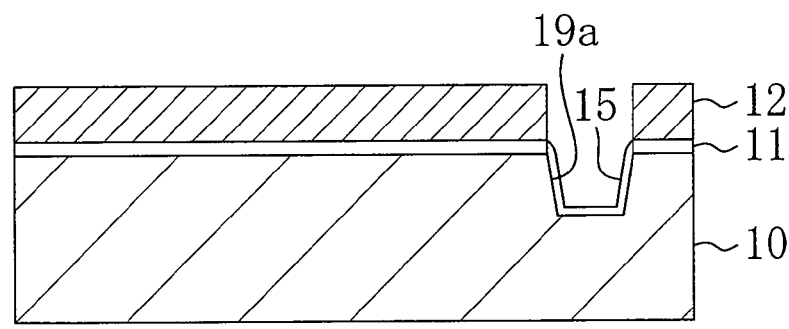
Figure 4A:
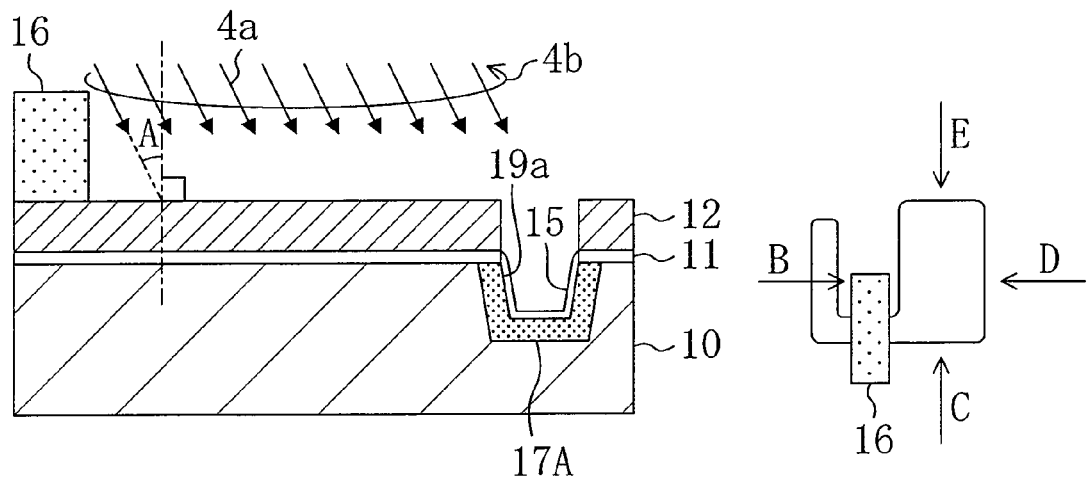
FIGS. 4A, 4B, and 4C are schematic cross-sectional views of the main part of the first example CMOS image sensor, illustrating the manufacturing method of the first example CMOS image sensor.
Figure 4B:
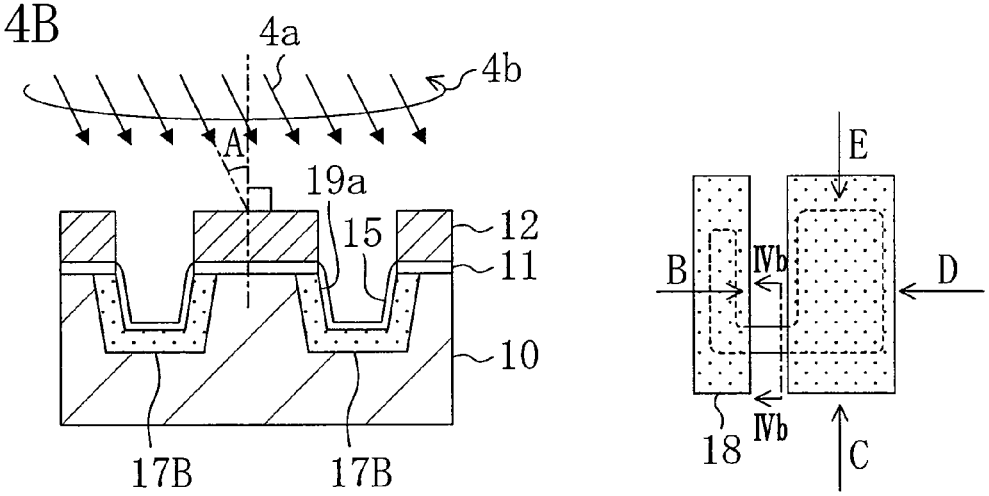
Figure 4C:
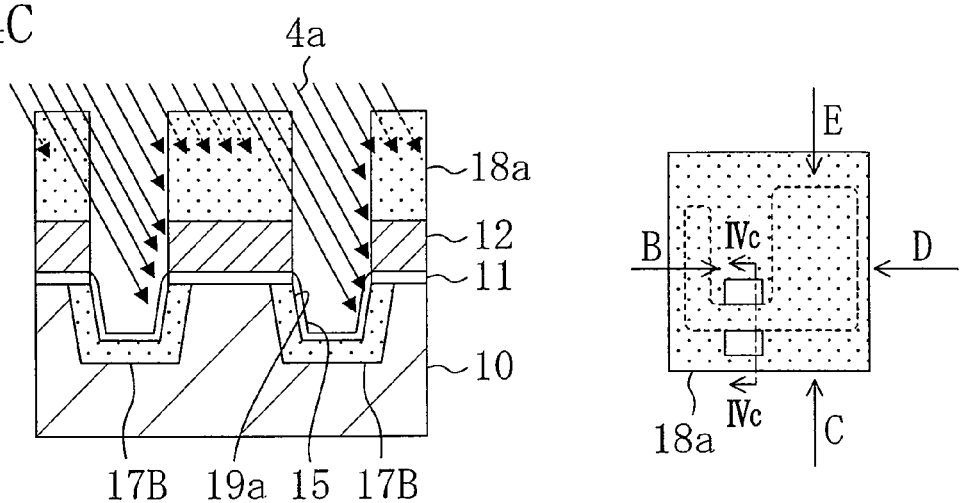

FIGS. 3A through 3C, FIGS. 4A through 4C, and FIGS. 5A through 5C are cross-sectional views of the main part of the first example CMOS image sensor 1, illustrating the manufacturing method of the first example CMOS image sensor 1. Note that each figure except FIGS. 4B and 4C shows a cross section corresponding to FIG. 2A, and FIGS. 4B and 4C show cross sections corresponding to FIG. 2B. In FIGS. 4A through 4C, a schematic plan view of the CMOS image sensor 1 is also shown in order to facilitate explanation of the ion implantation directions.

First, as shown in FIG. 3A, a silicon oxide film 11 having a thickness of, for example, 10 nm is grown on a substrate 10. The substrate 10 is made of, for example, silicon. A silicon nitride film 12 having a thickness of, for example, 150 nm is then grown on the silicon oxide film 11 by using an LP-CVD (Low-Pressure Chemical Vapor Deposition) method or the like.

As shown in FIG. 3B, a resist pattern 13 having a desired pattern is then formed on the silicon nitride film 12 by a lithography technique. The resist pattern 13 has an opening on an element isolation region formation region. By using the resist pattern 13 as a mask, the silicon nitride film 12, the silicon oxide film 11, and an upper part of the substrate 10 are removed to a desired depth by dry etching to form a trench 19a. The resist pattern 13 is then removed.

As shown in FIG. 3C, the sidewall and bottom portions of the trench 19a thus formed in the substrate 10 are oxidized to form an oxide film 15 having a thickness of, for example, 15 nm.

As shown in FIG. 4A, a resist pattern 16 having a desired pattern is then formed on the substrate 10 including the silicon nitride film 12. The resist pattern 16 is formed so that no impurity is implanted into the sidewall and bottom portions of the trench 19a located under a region where a gate electrode described below is to be formed (hereinafter, referred to as the "gate electrode formation region"). By using the resist pattern 16 as a mask, an ion implantation 4a of boron, which is p-type impurities, is performed, for example, at an implantation angle A (in this example, at an angle of 30° from the normal direction to a principal surface of the substrate 10) at an implantation energy of 20 keV and a dose of $8.0 \times 10^{12}$ ions/cm$^2$. In this ion implantation 4a, a plurality of ion implantations 4b are performed respectively from implantation directions B, C, D, and E to form an inactive layer 17A in the sidewall and bottom portions of the trench 19a located in the region other than the gate electrode formation region. By this step, the inactive layer 17A is formed in the sidewall and bottom portions of the trench 19a located around a region where a photodiode described below is to be formed (hereinafter, referred to as the "photodiode formation region"). Note that the thickness (diffusion layer width) of the inactive layer 17A, the range of the impurity concentration, and the preferred range thereof are as described above. The resist pattern 16 is then removed.

As shown in FIG. 4B, a resist pattern 18 having a desired pattern is formed over the substrate 10. The resist pattern 18 is formed so as to cover the sidewall and bottom portions of the trench 19a located in the region other than the gate electrode formation region, and to expose the sidewall and bottom portions of the trench 19a located in the gate electrode formation region. By using the resist pattern 18 as a mask, an ion implantation 4a of boron, which is p-type impurities, is performed, for example, at an implantation angle A (in this example, at an angle of 30° from the normal direction to the principal surface of the substrate 10) at an implantation energy of 150 keV and a dose of $6.0 \times 10^{12}$ ions/cm$^2$. In this ion implantation 4a, as in the step of FIG. 4A, a plurality of ion implantations 4b are performed respectively from implantation directions B, C, D, and E to form an inactive layer 17B in the sidewall and bottom portions of the trench 19a located in the gate electrode formation region. Note that the thickness (diffusion layer width) of the inactive layer 17B, the range of the impurity concentration, and the preferred range thereof are as described above. The resist pattern 18 is then removed.

As can be seen from the steps of FIGS. 4A and 4B, the ion implantation dose into the sidewall and bottom portions of the trench 19a located under the gate electrode formation region is made smaller than that into the sidewall and bottom portions of the trench 19a located around the photodiode formation region. The impurity concentration of the inactive layer 17B is therefore smaller than that of the inactive layer 17A.

The step of FIG. 4B may be replaced with the step of FIG. 4C. More specifically, as shown in FIG. 4C, a resist pattern 18a may be formed so as to expose only a region on the trench 19a in the gate electrode formation region, and as in the case of FIG. 4B, a plurality of ion implantations 4a may be performed by using the resist pattern 18a. In this example, the height of the resist pattern 18a is adjusted so that a part of each ion implantation 4a passes through the ends of the resist pattern 18a. The concentration of the impurities which are implanted in the sidewall and bottom portions of the trench 19a can be varied by such adjustment. In other words, in the inactive layer 17B formed in the sidewall portions of the trench 19a, the impurity concentration of an upper part close to the surface side of the substrate 10 can be made higher than that of a lower part close to the bottom portion of the trench 19a. Moreover, the impurity concentration of the inactive layer 17B formed in the bottom portion of the trench 19a can be made lower than that of the upper part of the inactive layer 17B formed in the sidewall portions of the trench 19a. This can implement a structure having a significant effect of suppressing a leakage current and a dark current which are generated especially from the interface of the gate oxide film.

Figure 5A:
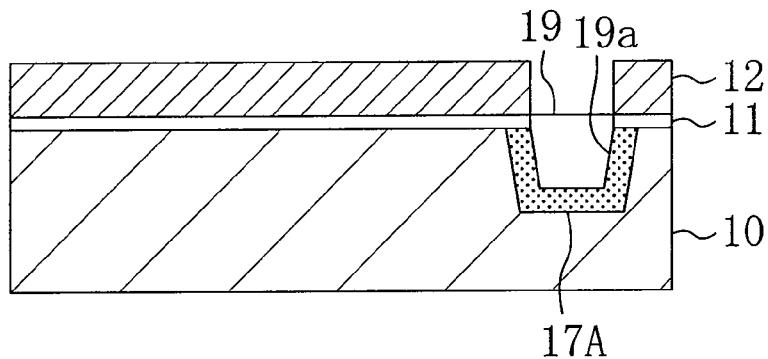
FIGS. 5A, 5B, and 5C are schematic cross-sectional views of the main part of the first example CMOS image sensor, illustrating the manufacturing method of the first example CMOS image sensor.

As shown in FIG. 5A, the trench 19a is then filled with a dielectric material such as silicon dioxide ($SiO_2$) by, for example, a CVD method. The surface of the dielectric material in the trench 19a is then planarized by a CMP (Chemical Mechanical Polishing) method or the like to form a trench isolation region 19. Note that, in this step, the surface of the trench isolation region 19 may be flush with the surface of the substrate 10, or may slightly protrude from the surface of the substrate 10.

Figure 5B:
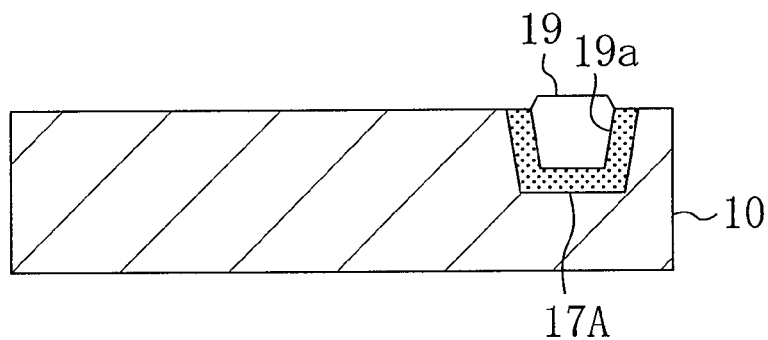

As shown in FIG. 5B, the silicon nitride film 12 and the silicon oxide film 11 are then sequentially removed.

Figure 5C:
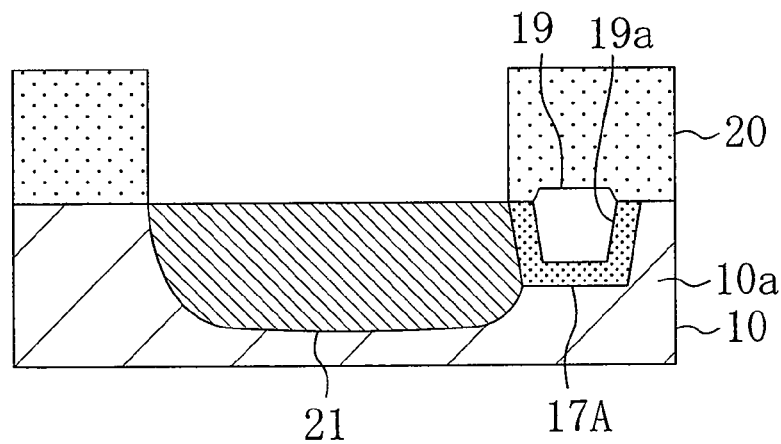

As shown in FIG. 5C, a p-type region 10a is then formed in the substrate 10 by a known method, and a resist pattern 20 having a desired pattern is formed over the substrate 10 so as to cover a region other than the photodiode formation region. By using the resist pattern 20 as a mask, arsenic ions, which are n-type impurities, are implanted into the element formation region of the substrate 10 surrounded by the trench isolation region 19 at, for example, an implantation energy of 350 keV and an implantation dose of $2.0 \times 10^{12}$ ions/cm$^2$ to form an n-type region 21. The resist pattern 20 is then removed.

Figure 6A:
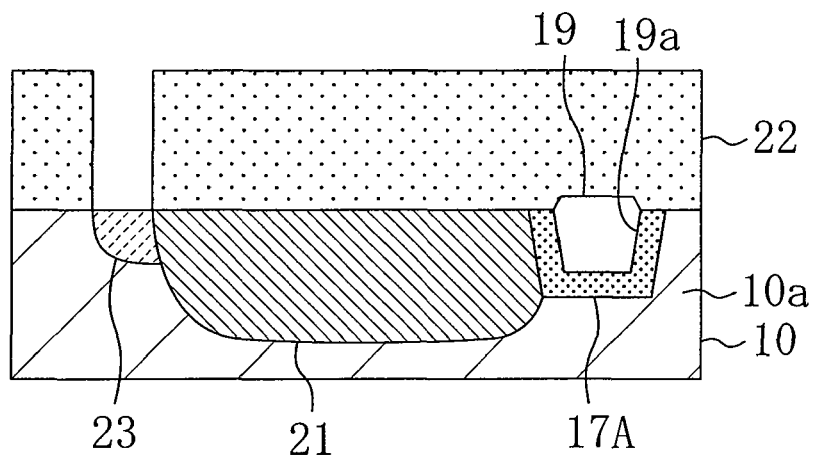
FIGS. 6A, 6B, and 6C are schematic cross-sectional views of the main part of the first example CMOS image sensor, illustrating the manufacturing method of the first example CMOS image sensor.

As shown in FIG. 6A, a resist pattern 22 having a desired pattern is then formed over the substrate 10 so as to cover a region other than a region where a control implantation layer located under the gate electrode described below is to be formed. By using the resist pattern 22 as a mask, boron ions, which are p-type impurities, are implanted into the element formation region of the substrate 10 at, for example, an implantation energy of 100 keV and an implantation dose of $1.5 \times 10^{12}$ ions/cm$^2$ to form an p-type control implantation layer 23 adjacent to the n-type region 21. The p-type control implantation layer 23 is a layer for controlling the threshold voltage of the transfer transistor. The resist pattern 22 is then removed.

Figure 6B:
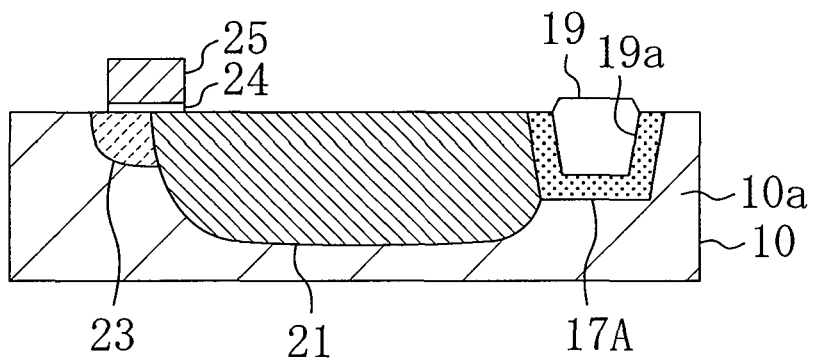

As shown in FIG. 6B, a gate insulating film 24 and a gate electrode 25 are then sequentially formed on a part of the n-type region 21 and on the control implantation layer 23 in the element formation region of the substrate 10.

Figure 6C:
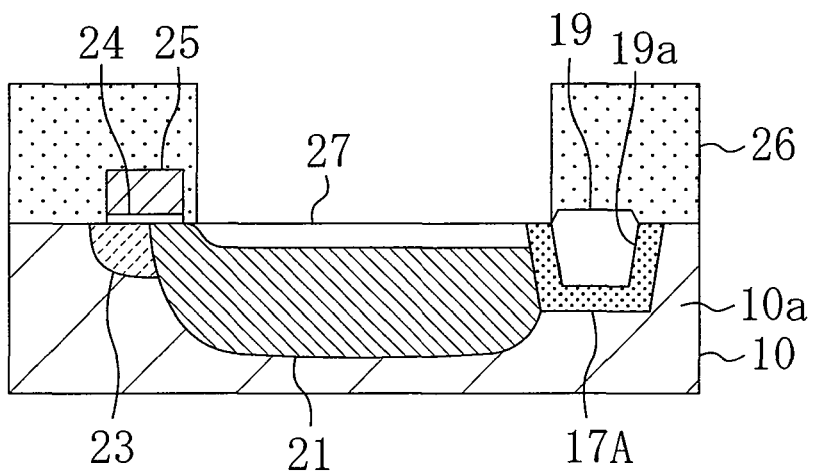

As shown in FIG. 6C, a resist pattern 26 is then formed over the substrate 10 so as to cover the gate electrode 25 and to expose the upper surface of the n-type region 21. By using the resist pattern 26 as a mask, boron ions, which are p-type impurities, are implanted into the element formation region of the substrate 10 at, for example, an implantation energy of 3 keV and an implantation dose of $5.0 \times 10^{13}$ ions/cm$^2$ to form a p-type region 27 in an upper part of the n-type region 21. The resist pattern 26 is then removed.

Figure 7A:
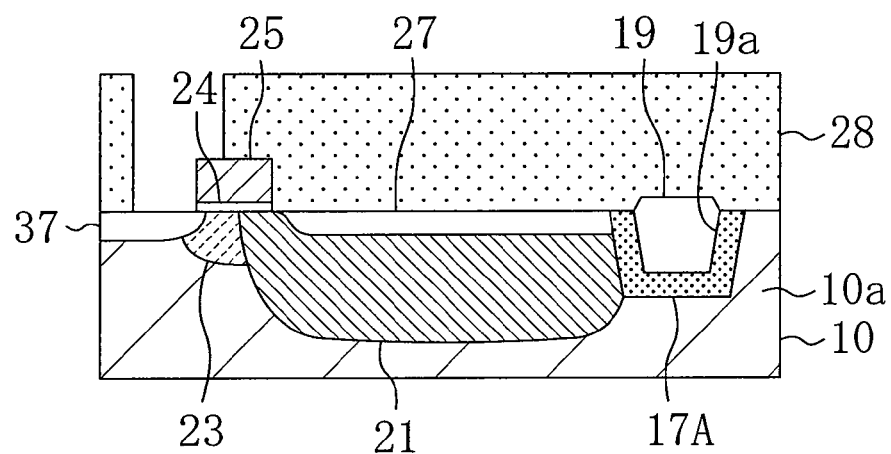
FIGS. 7A and 7B are schematic cross-sectional views of the main part of the first example CMOS image sensor, illustrating the manufacturing method of the first example CMOS image sensor.

As shown in FIG. 7A, a resist pattern 28 is then formed over the substrate 10 so as to expose a region located on the opposite side to the region where the p-type region 27 is formed, with respect to the gate electrode 25. By using the resist pattern 28, arsenic ions, which are n-type impurities, are implanted into the element formation region of the substrate 10 at, for example, an implantation energy of 20 keV and an implantation dose of $4.0 \times 10^{14}$ ions/cm$^2$ to form an n-type floating diffusion region 37. At this time, boron ions may be implanted at, for example, an implantation energy of 30 keV and an implantation dose of $2.0 \times 10^{12}$ ions/cm$^2$ to form a p-type punch-through stopper region (not shown) which covers the bottom surface of the floating diffusion region 37. The resist pattern 28 is then removed.

Figure 7B:
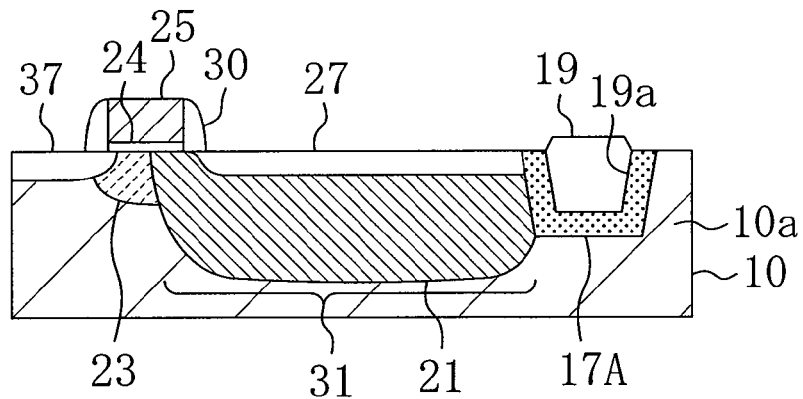

As shown in FIG. 7B, sidewalls 30 are then formed on the sidewalls of the gate electrode 25. Although the subsequent steps are not shown in the figures, an interlayer insulating film, a light-shielding film, a protective film, an in-layer lens, a planarizing film, a color filter, a top lens, and the like are typically formed by known methods.

In this manner, the transfer transistor having the gate electrode 25 is formed on the control implantation layer 23 located between the n-type region 21 of the photodiode region 31 and the floating diffusion region 37. In this transfer transistor, the gate electrode 25 is formed so that both ends of the gate electrode 25 respectively overlap a part of the n-type region 21 of the photodiode region 31 and a part of the floating diffusion region 37. The gate electrode 25 of the transfer transistor transfers charges accumulated in the photodiode region 31 formed by the p-type region 10a, the n-type region 21, and the p-type region 27 to the floating diffusion region 37.

The first example solid-state image sensor having the above-described effects can be manufactured in this manner.

Second Embodiment

Figure 8:
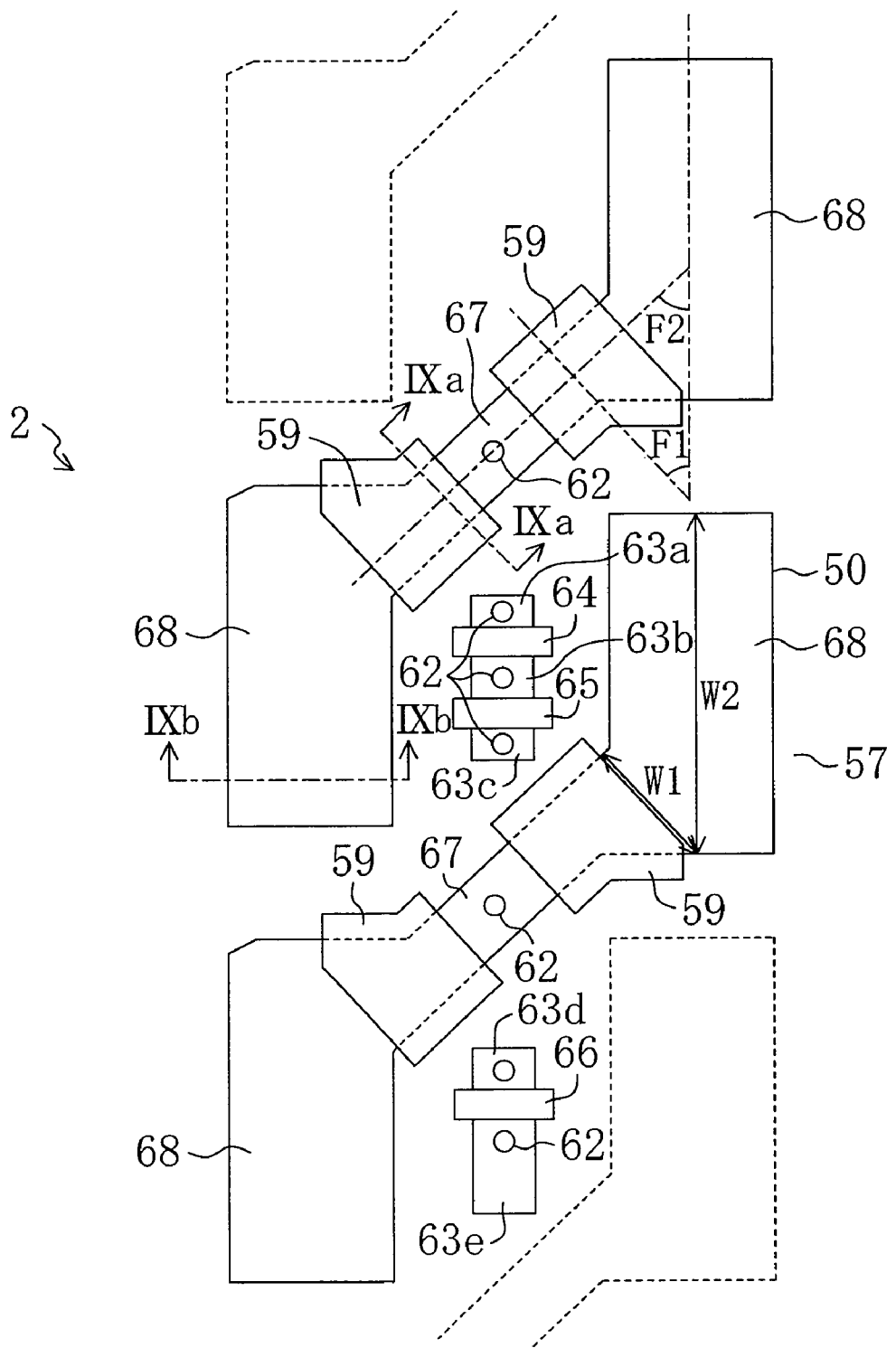
FIG. 8 is a diagram showing a structure of a second example solid-state image sensor, and more specifically, is a schematic plan view of a 4-pixel, 1-cell type CMOS image sensor.

FIG. 8 shows a structure of a second example solid-state image sensor. More specifically, FIG. 8 is a schematic plan view of a 4-pixel, 1-cell type CMOS image sensor 2.

As shown in FIG. 8, the second example CMOS-type image sensor 2 has a trench isolation region 57, photodiode regions 68, n-type floating diffusion regions (sense nodes) 67, and gate electrodes 59. The trench isolation region 57 is formed in a semiconductor substrate (hereinafter, referred to as the "substrate") 50 made of silicon. Each photodiode region 68 is formed in a first element formation region of the substrate 10 which is defined by the trench isolation region 57. Each photodiode region 68 serves as a charge accumulating region for converting incident light to signal charges and accumulating the signal charges therein. Each n-type floating diffusion region 67 is formed in the first element formation region, and accumulates the signal charges of corresponding photodiode regions 68. Each gate electrode 59 is formed over the first element formation region located between a corresponding photodiode region 68 and a corresponding floating diffusion region 67. The gate electrode 59 is formed so that both ends of the gate electrode 59 respectively overlap a part of the photodiode region 68 and a part of the floating diffusion region 67. A transfer transistor is formed by the gate electrode 59, the photodiode region 68, and the floating diffusion region 67. The gate electrode 59 transfers signal charges generated in the charge accumulating region of the photodiode region 68 to the floating diffusion region 67. A first width W1 in the gate width direction of the photodiode region 68 located under one end of the gate electrode 59 is smaller than a second width W2 in the longitudinal direction in the middle of the photodiode region 68.

In the present embodiment, the gate width direction of the gate electrode 59 is tilted with respect to the longitudinal direction of the photodiode region 68. An angle F1 between the longitudinal direction of the photodiode region 68 and the gate width direction of the gate electrode 59 is preferably 45°.

In other words, the longitudinal direction of the element formation region where the gate electrode 59 and the floating diffusion region 67 are formed is tilted with respect to the longitudinal direction of the element formation region where the photodiode region 68 is formed. The floating diffusion region 67 is formed in an oblique direction tilted at an angle F2 with respect to the longitudinal direction of the photodiode region 68. Moreover, one floating diffusion region 67 is provided for every two photodiode regions 68, and each floating diffusion region 67 is shared by corresponding two photodiode regions 68.

A reset transistor having a gate electrode 64, and a source follower transistor having a gate electrode 65 are formed in a second element formation region of the substrate 50 surrounded by the trench isolation region 57. A row select access transistor having a gate electrode 66 is formed in a third element formation region of the substrate 50 surrounded by the trench isolation region 57. The reset transistor is formed by an n-type source/drain region 63a, a gate electrode 64, and an n-type source/drain region 63b. The n-type source/drain region 63a is formed in the second element formation region, and the gate electrode 64 is formed over the second element formation region. The n-type source/drain region 63b is formed in the second element formation region, and is positioned on the opposite side to the source/drain region 63a with respect to the gate electrode 64. The source follower transistor is formed by the source/drain region 63b, the gate electrode 65, and an n-type source/drain region 63c. The gate electrode 65 is formed over the second element formation region, and is positioned on the opposite side to the gate electrode 64 with respect to the source/drain region 63b. The n-type source/drain region 63c is formed in the second element formation region, and is positioned on the opposite side to the source/drain region 63b with respect to the gate electrode 65. The row select access transistor is formed by an n-type source/drain region 63d, the gate electrode 66, and an n-type source/drain region 63e. The n-type source/drain region 63d is formed in the third element formation region, and the gate electrode 66 is formed over the third element formation region. The n-type source/drain region 63e is formed in the third element formation region, and is positioned on the opposite side to the source/drain electrode 63d with respect to the gate electrode 66.

The floating diffusion region 67 is connected to the gate electrode 65 of the source follower transistor. The source follower transistor supplies an output signal to the row select access transistor. The gate electrode 66 of the row select access transistor selectively gates an output signal to a contact 62 formed in the source/drain region 63e. The reset transistor resets the floating diffusion region 67 to a predetermined charge level before each charge transfer from the photodiode region 68. Note that contacts 62 are formed in a not-shown insulating film to connect to the respective gate electrodes and other connection lines in the CMOS image sensor. Therefore, the contacts 62 implement electric connection to, for example, the source/drain regions 63a through 63e, the floating diffusion region 67, and other interconnects.

Figure 9A:
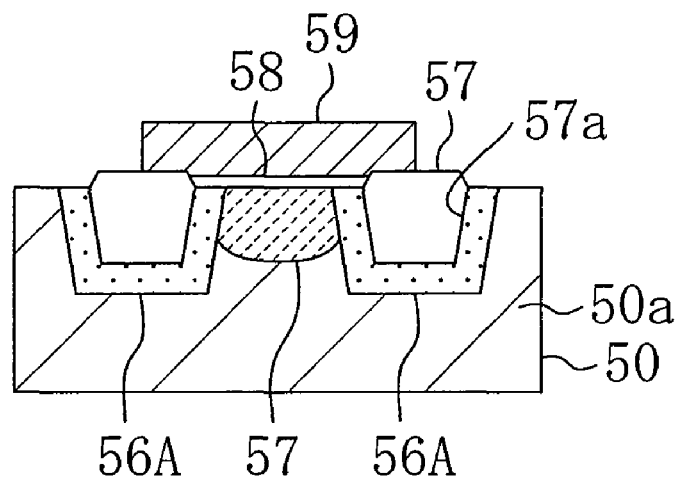
FIGS. 9A and 9B are schematic cross-sectional views of a main part of the second example CMOS image sensor shown in FIG. 8, where
Figure 9B:
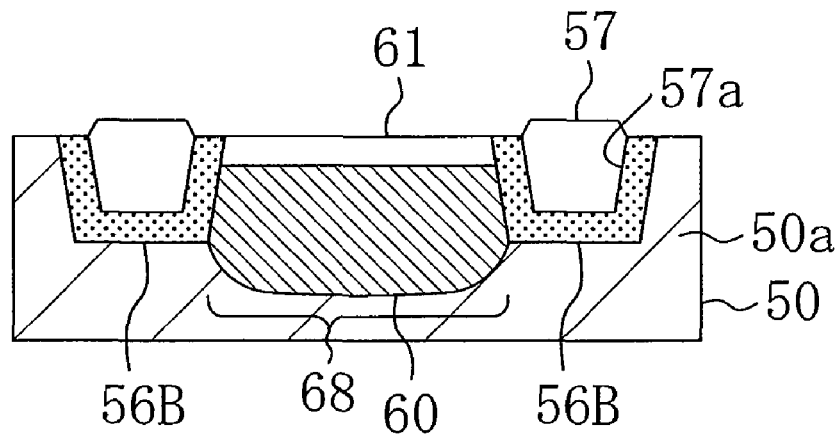

FIGS. 9A and 9B are schematic cross-sectional views of the main part of the CMOS image sensor 2 shown in FIG. 8. FIG. 9A shows a cross section corresponding to line IXa-IXa in FIG. 8, and FIG. 9B shows a cross section corresponding to line IXb-IXB in FIG. 8. Although not shown in the figure, a cross section from the photodiode region 68 to the gate electrode 59 and the vicinity of the contact 62 of the floating diffusion region 67 in the gate length direction of the gate electrode 59 of FIG. 8 has the same structure as that of FIG. 2A of the first embodiment, and description thereof will be herein omitted.

In the cross section of FIG. 9A, a control implantation layer 57 is formed in an element formation region in a p-type region 50a of the silicon substrate 50. In other words, the control implantation layer 57 is formed in a region surrounded by the trench isolation region 57. The trench isolation region 57 is formed by filling a trench 57a with a dielectric material such as silicon dioxide ($SiO_2$) by a CVD method, and serves as an element isolation region. The gate electrode 59 is formed over the surface of the element formation region with a gate insulating film 58 interposed therebetween, so as to cover the control implantation layer 57. The gate electrode 59 is formed so that both ends of the gate electrode 59 in the gate width direction are positioned on the trench isolation region 57. In order to suppress dark current generation, a p-type inactive layer 56A is formed in the bottom and sidewall portions of the trench isolation region 57 located under the gate electrode 59 in the substrate 50. The p-type inactive layer 56A has a thickness (diffusion layer width) of 10 nm to 250 nm (preferably, 120 nm), a peak concentration of $1.0 \times 10^{16}$ to $4.5 \times 10^{18}$ $cm^{-3}$ (preferably, $1.0 \times 10^{17}$ $cm^{-3}$). Note that impurities having an opposite conductivity type to that of impurities for forming a depletion region (n-type region 60) of the photodiode region 68 described below, that is, p-type impurities, can be implanted when forming the inactive layer 56A. The trench isolation region 57 is formed by an STI method. The depth of the trench 57a is 100 nm to 350 nm, and preferably, 250 nm. The width of the trench 57a is 50 nm to 500 nm, and more preferably, 150 nm.

In the cross section of FIG. 9B, the n-type region 60 is formed on the p-type region 50a in the element isolation region surrounded by the trench isolation region 57 in the substrate 50. A p-type region 61 is formed in an upper part of the n-type region 60. The photodiode region 68 is thus formed by a p-n-p junction region formed by the p-type region 50a, the n-type region 60, and the p-type region 61. In order to suppress dark current generation, a p-type inactive layer 56B is formed in the bottom and sidewall portions of the trench isolation region 57 in the region other than the region located under the gate electrode 59 in the substrate 50, as in the structure of FIG. 9A. The p-type inactive layer 56B has a thickness (diffusion layer width) of 10 nm to 250 nm (preferably, 120 nm), a peak concentration of $5.0 \times 10^{16}$ to $5.0 \times 10^{18}$ $cm^{-3}$ (preferably, $3.0 \times 10^{17}$ $cm^{-3}$). Note that, like the inactive layer 56A, impurities having an opposite conductivity type to that of impurities for forming a depletion region (n-type region 60) of the photodiode region 68, that is, p-type impurities, can be implanted when forming the inactive layer 56B. The impurity concentration of the inactive layer 56A formed in the region located under the gate electrode 59 is made lower than that of the inactive layer 56B formed in the region other than the region located under the gate electrode 59.

In the CMOS image sensor cell 2 having the above structure, incident light causes electrons to gather in the n-type region 60. A maximum output signal, which is generated by the source follower transistor having the gate electrode 59, is proportional to the number of electrons to be discharged from the n-type region 60. The maximum output signal increases with increase in electron capacitance or acceptability of the n-type region 60 for acquiring electrons. The electron capacitance of the photodiode region 68 typically depends on the doping level of the image sensor and the impurities which are implanted into an active layer.

According to the second example CMOS image sensor 2, as a structure of the inactive layers 56A, 56B formed in the bottom and sidewall portions of the trench isolation region 57, the peak concentration of the inactive layer 56A in the region under the gate electrode 59 is lower than that of the inactive layer 56B in the remaining region. As compared to the case where the inactive layer 56B is formed in the entire region including the region under the gate electrode 59, the above structure prevents increase in threshold voltage of the transfer transistor due to the narrow channel effect, and implements a lower threshold voltage of the transfer transistor, whereby transfer characteristics can be improved. As a result, a high image quality solid-state image sensor having a sufficiently large number of saturation electrons and capable of suppressing noise is implemented. Moreover, since the inactive layers 56A, 56B are formed, generation of a dark current and a leakage current around the photodiode region 68 can be suppressed to a low level.

As described in the first embodiment, when the width of the element isolation region under the gate electrode 59 is smaller than 500 nm in the present embodiment, the inactive layers 56A facing each other may be formed adjacent to each other without forming the control implantation layer in the region interposed between the trench isolation regions 57 under the gate electrode 59, so that the inactive layers 56A serve also as the control implantation layer.

A manufacturing method of the second example solid-state image sensor, and more specifically, a manufacturing method of the above CMOS image sensor 2 having the structure of FIG. 8 and FIGS. 9A and 9B, will now be described.

FIGS. 10A through 10C, FIGS. 11A through 11D, FIGS. 12A through 12D, and FIGS. 13A and 13B are cross-sectional views of a main part of the second example CMOS image sensor 2, illustrating the manufacturing method of the second example CMOS image sensor 2. Note that each figure except FIGS. 12A through 12D shows a cross section corresponding to FIG. 9A, and FIGS. 12B through 12D show cross sections corresponding to FIG. 9B. In FIGS. 11A through 11D, a schematic plan view of the CMOS image sensor 2 is also shown in order to facilitate explanation of the ion implantation directions.

Figure 10A:
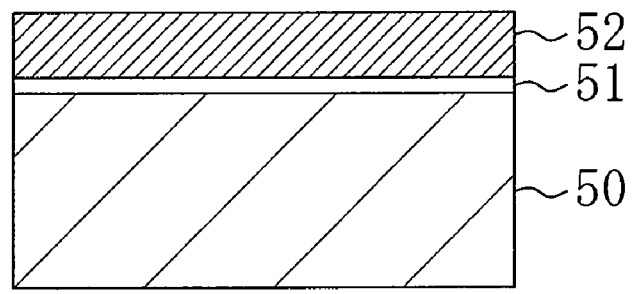
FIGS. 10A, 10B, and 10C are schematic cross-sectional views of the main part of the second example CMOS image sensor, illustrating a manufacturing method of the second example CMOS image sensor.

First, as shown in FIG. 10A, a silicon oxide film 51 having a thickness of, for example, 10 nm is grown on a substrate 50. The substrate 50 is made of, for example, silicon. A silicon nitride film 52 having a thickness of, for example, 150 nm is then grown on the silicon oxide film 51 by using an LP-CVD method or the like.

Figure 10B:
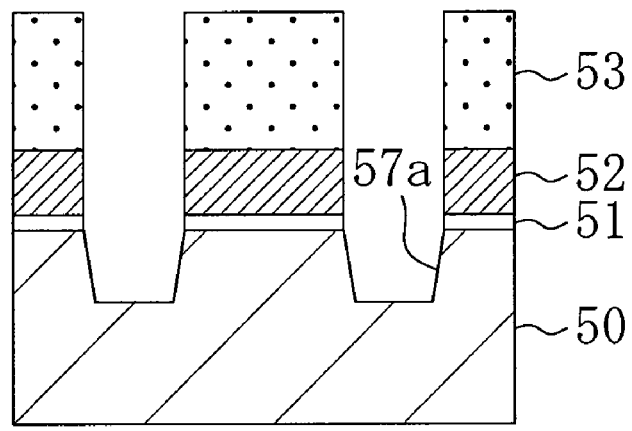

As shown in FIG. 10B, a resist pattern 53 having a desired pattern is then formed on the silicon nitride film 52 by a lithography technique. The resist pattern 53 has an opening on an element isolation region formation region. By using the resist pattern 53 as a mask, the silicon nitride film 52, the silicon oxide film 51, and an upper part of the substrate 50 are removed to a desired depth by etching to form a trench 57a. The resist pattern 53 is then removed.

Figure 10C:
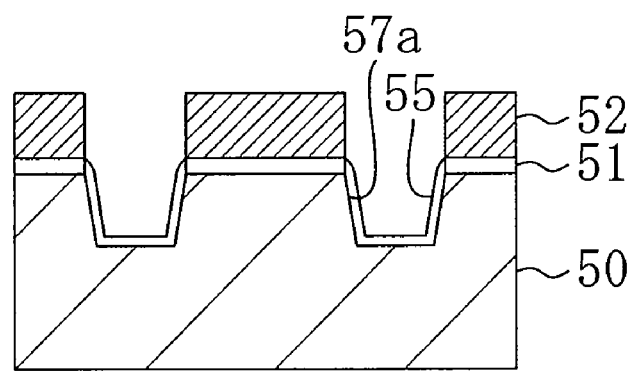

As shown in FIG. 10C, the sidewall and bottom portions of the trench 57a thus formed in the substrate 50 are oxidized to form an oxide film 55 having a thickness of, for example, 15 nm.

In the steps shown in FIGS. 11A through 11D and FIGS. 12A through 12D, boron ions, which are p-type impurities, are implanted at, for example, an implantation energy of 20 keV and an implantation dose of $8.0 \times 10^{12}$ ions/$cm^2$ from the following four directions tilted at 300 from the normal direction to a principal surface of the substrate 50: G (the gate length direction of the gate electrode); H (the gate width direction of the gate electrode); I (the gate length direction of the gate electrode); and J (the gate width direction of the gate electrode).

Figure 11A:
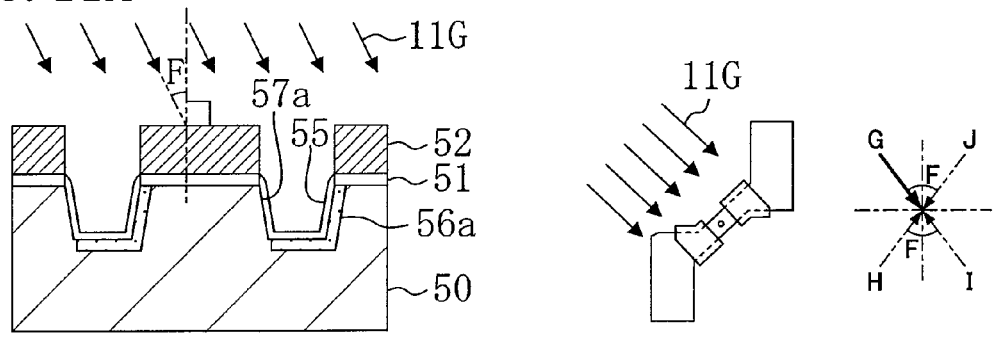
FIGS. 11A, 11B, 11C, and 11D are schematic cross-sectional views of the main part of the second example CMOS image sensor, illustrating the manufacturing method of the second example CMOS image sensor.
Figure 11B:
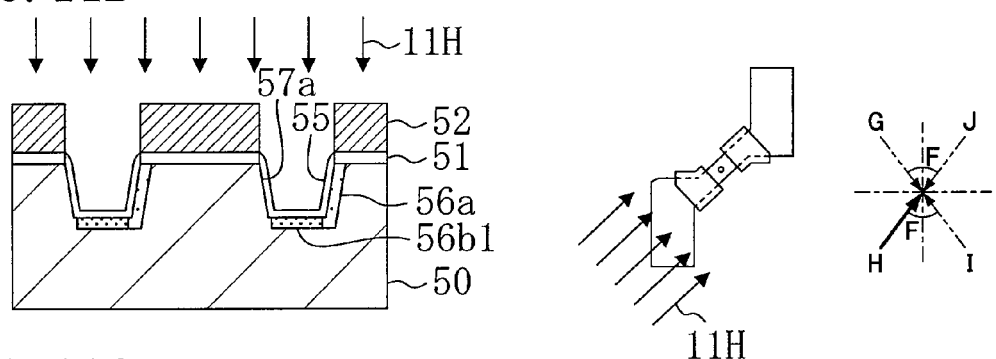
Figure 11C:
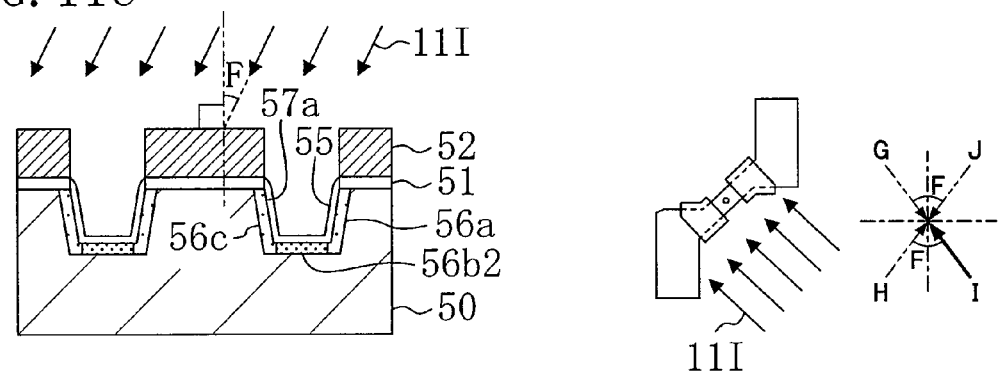
Figure 11D:
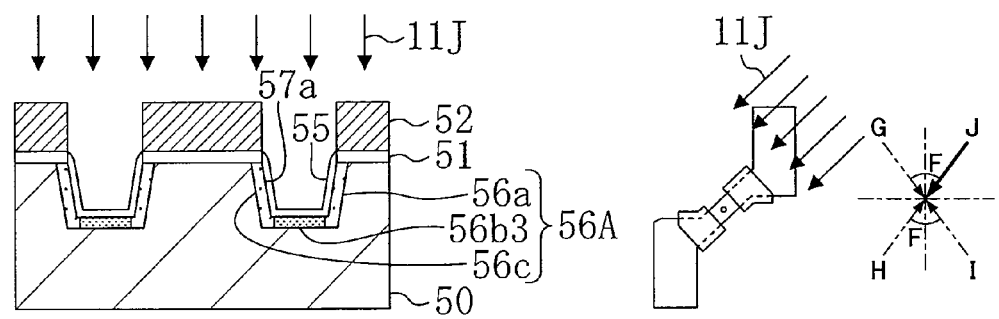

More specifically, in the cross section corresponding to FIG. 9A, an ion implantation 11G is first performed from the direction G, as shown in FIG. 11A, to form an ion implantation region 56a in the bottom portion and one sidewall portion of the trench 57a. As shown in FIG. 11B, an ion implantation 11H is then performed from the direction H to form an ion implantation region 56b1 in the bottom portion of the trench 57a. An ion implantation 11I is then performed from the direction I to form an ion implantation region 56b2 in the bottom portion of the trench 57a and to form an ion implantation region 56c in the other sidewall portion of the trench 57a. An ion implantation 11J is then performed from the direction J to form an ion implantation region 56b3 in the bottom portion of the trench 57a. By performing the ion implantations from the four directions in this manner, the directions of the ion implantations 11H and 11J, which are parallel to the gate length direction of the gate electrode 59, become parallel to a charge transfer path of the transfer transistor. Therefore, in the ion implantations 11H and 11J, no ion is implanted into the sidewall portions of the trench 57a located under the gate electrode 59. In other words, the sidewall portions of the trench 57a located under the gate electrode 59 are subjected to only one ion implantation, that is, the ion implantation 11G to one sidewall portion, or the ion implantation 11H to the other sidewall portion.

Figure 12A:
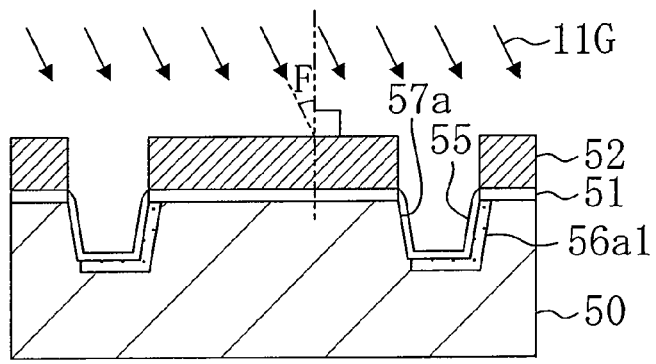
FIGS. 12A, 12B, 12C, and 12D are schematic cross-sectional views of the main part of the second example CMOS image sensor, illustrating the manufacturing method of the second example CMOS image sensor.
Figure 12B:
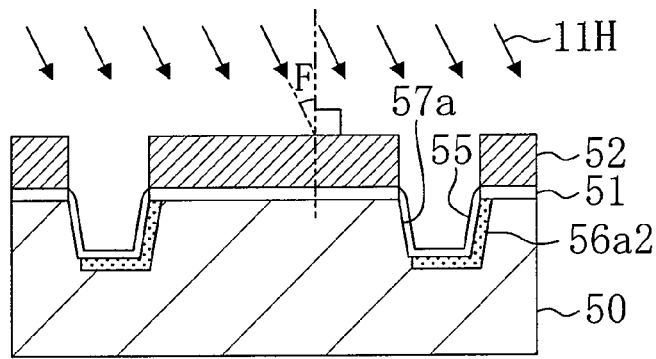
Figure 12C:
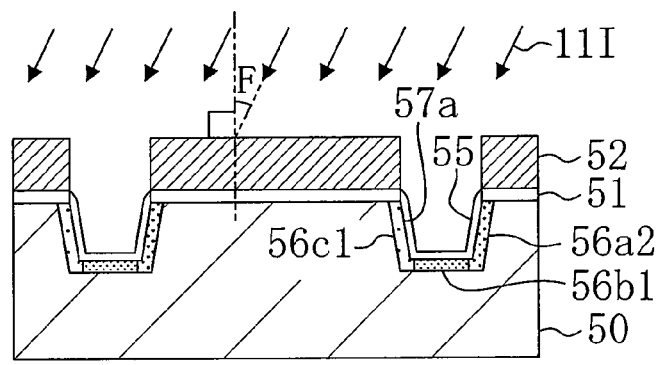
Figure 12D:
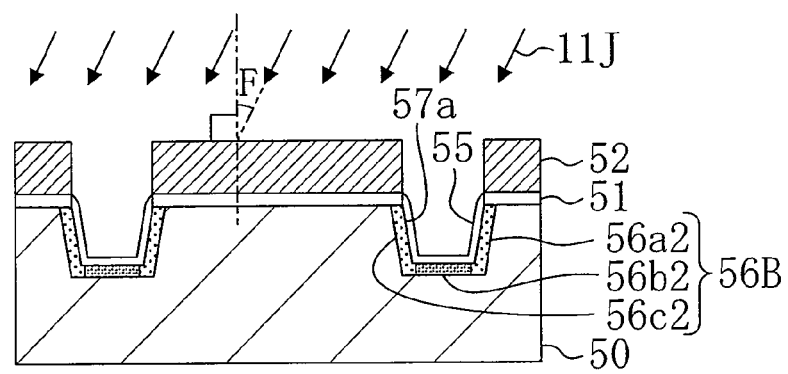

In the cross section corresponding to FIG. 9B, on the other hand, as shown in FIG. 12A, the ion implantation 11G is first performed from the direction G in the step of FIG. 11A to form an ion implantation region 56a1 in the bottom portion and one sidewall portion of the trench 57a. As shown in FIG. 12B, the ion implantation 11H is then performed from the direction H in the step of FIG. 11B to form an ion implantation region 56a2 in the bottom portion and one sidewall portion of the trench 57a1. As shown in FIG. 12C, the ion implantation 11I is then performed from the direction I in the step of FIG. 11C to form an ion implantation region 56b1 in the bottom portion of the trench 57a and to form an ion implantation region 56c1 in the other sidewall portion of the trench 57a. As shown in FIG. 12D, the ion implantation 11J is then performed from the direction J in the step of FIG. 11D to form an ion implantation region 56b2 in the bottom portion of the trench 57a and to form an ion implantation region 56c2 on the other sidewall portion of the trench 57a. In this manner, the sidewall portions of the trench 57a, which include a peripheral region of the photodiode region 68 and which are not parallel to the sidewall portions of the trench 57a adjacent to the floating diffusion region 67, are subjected to two ion implantations at every point. Accordingly, the impurity concentration of the inactive layer 56A in the region located under the gate electrode 59 is lower than that of the inactive layer 56B in the remaining region.

Figure 13A:
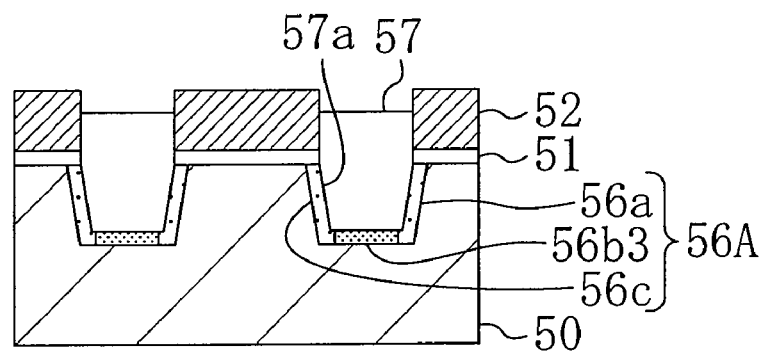
FIGS. 13A and 13B are schematic cross-sectional views of the main part of the second example CMOS image sensor, illustrating the manufacturing method of the second example CMOS image sensor.
Figure 13B:
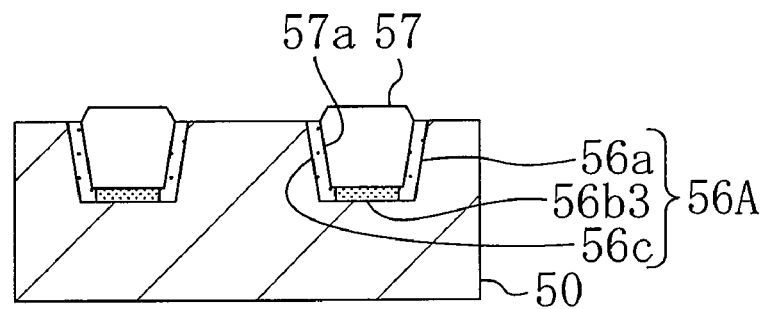
Figure 14:
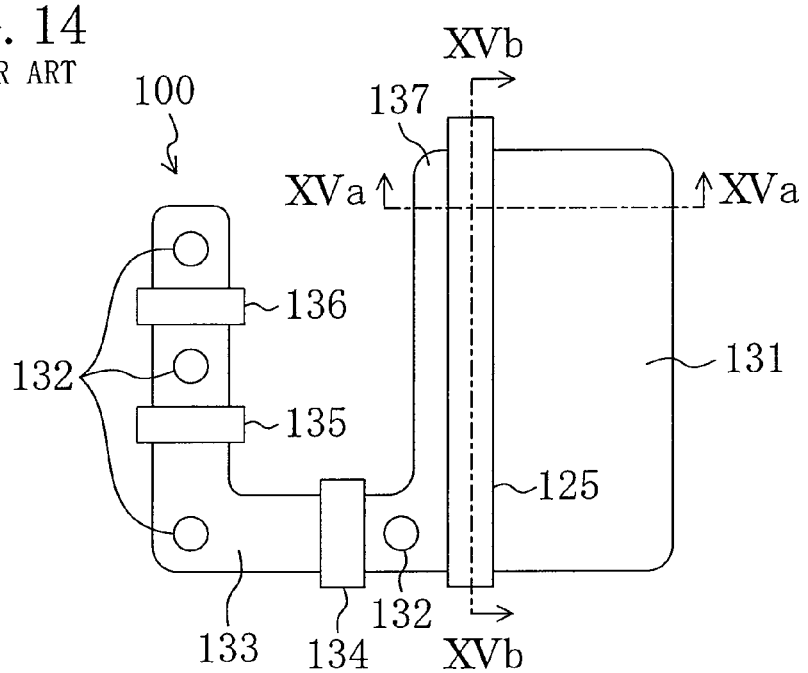
FIG. 14 is a structural diagram of a conventional solid-state image sensor, and more specifically, is a schematic plan view of a CMOS image sensor having 1-pixel, 4-transistor (4T) type pixel cells.
Figure 15A:
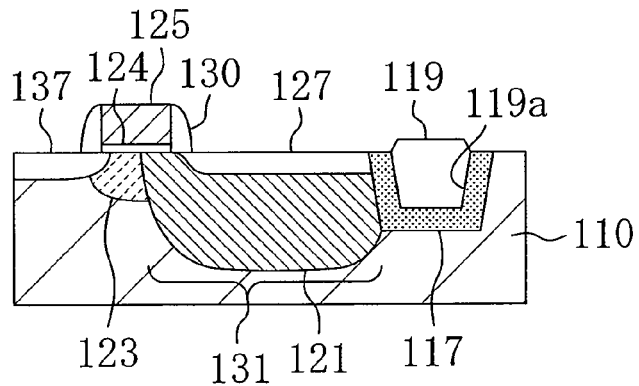
FIGS. 15A and 15B are schematic cross-sectional views of a main part of the solid-state image sensor shown in FIG. 14, where
Figure 15B:
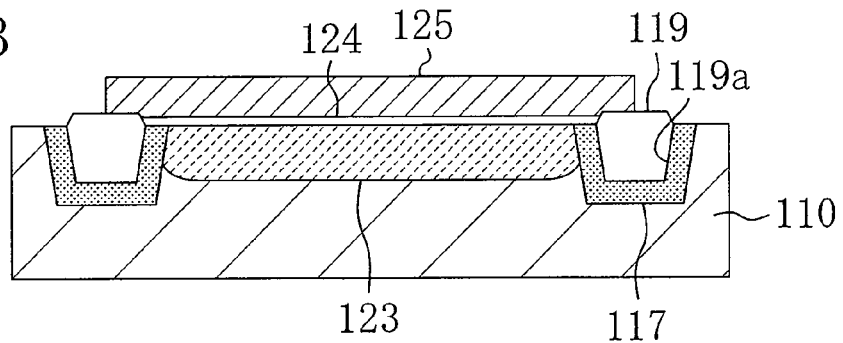
Figure 16A:
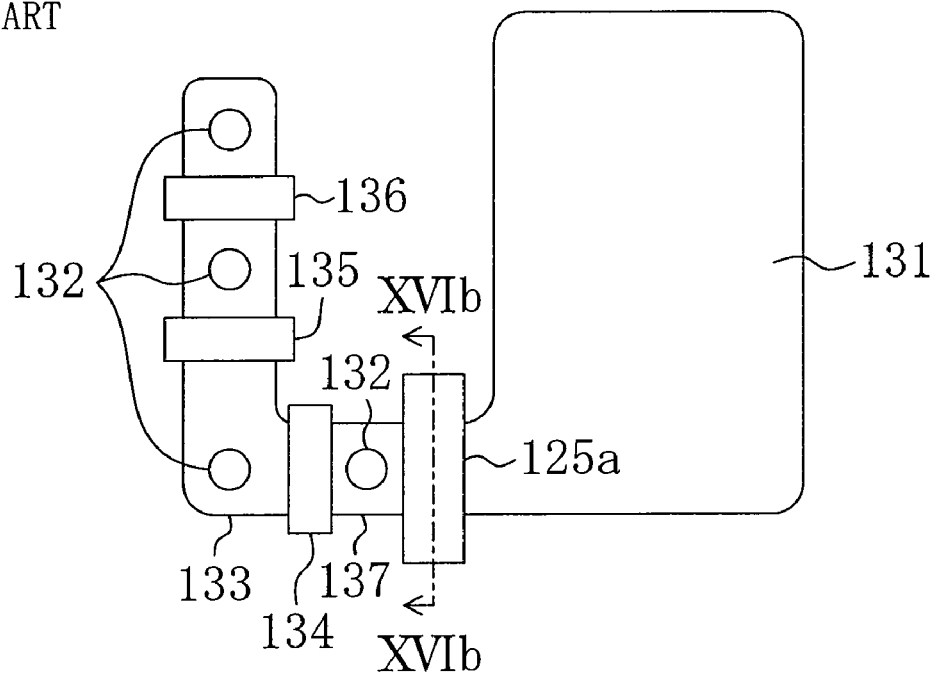
FIG. 16A is a structural diagram of a conventional solid-state image sensor, and more specifically, is a schematic plan view of a CMOS image sensor having 1 pixel, 4-transistor (4T) type pixel cells, which is different from the CMOS image sensor of FIG. 14.
Figure 16B:
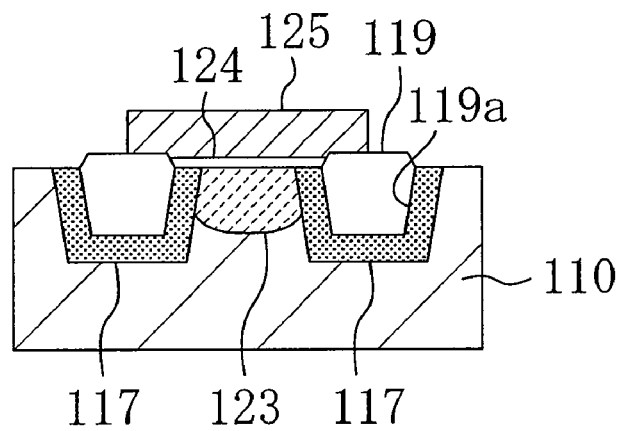
FIG. 16B shows a cross section corresponding to line XVIb-XVIb in FIG. 15.

As shown in FIG. 13A, the trench 57a is then filled with a dielectric material such as silicon dioxide by, for example, a CVD method. The surface of the dielectric material in the trench 57a is then planarized by a CMP method or the like to form a trench isolation region 57. As shown in FIG. 13B, the silicon nitride film 52 and the silicon oxide film 51 are then sequentially removed. The subsequent steps are the same as those described in the first embodiment with reference to FIG. 5C, FIGS. 6A through 6C, and FIGS. 7A and 7B.

The second example solid-state image sensor having the above-described effects can be manufactured in this manner.

Note that, the above description was given to the case where the angle F1 between the longitudinal direction of the photodiode region 68 and the gate width direction of the gate electrode 59 is 45°. However, when the angle F1 is larger than 0° and smaller than 180°, the present invention can be carried out in the same manner as described above by varying the impurity state of the inactive layer which is formed in the sidewall portions of the trench 57a. The impurity state of the inactive layer which is formed in the sidewall portions of the trench 57a can be varied by combining an ion implantation from a direction parallel to the gate length direction of the gate electrode 59 and an ion implantation from a direction not parallel to the gate length direction of the gate electrode 59.

The above example solid-state image sensors and the manufacturing methods thereof are useful for a solid-state image sensor which has an inactive layer in bottom and sidewall portions of a trench isolation region in order to suppress dark current generation around a photodiode, and a manufacturing method thereof.

What is claimed is:

1. A solid-state image sensor, comprising:
a trench isolation region formed in a semiconductor substrate, and defining an element formation region;
a photodiode region formed in the element formation region, for converting incident light to signal charges and accumulating the signal charges therein;
a floating diffusion region formed in the element formation region, for accumulating the signal charges of the photodiode region;
a gate electrode formed over the element formation region located between the photodiode region and the floating diffusion region, and formed so that both ends of the gate electrode respectively overlap a part of the photodiode region and a part of the floating diffusion region; and
an inactive layer formed in a region located in a bottom portion and sidewall portions of the trench isolation region in the semiconductor substrate, wherein
an impurity concentration in a region located under the gate electrode in the inactive layer is lower than that in a region other than the region located under the gate electrode in the inactive layer.

2. The solid-state image sensor of claim 1, wherein
the region other than the region located under the gate electrode in the inactive layer includes a region near the photodiode region in the inactive layer.

3. The solid-state image sensor of claim 1, wherein
in the region located in the sidewall portions of the trench isolation region in the inactive layer, an impurity concentration in an upper part close to a surface side of the semiconductor substrate is higher than that in a lower part close to the bottom portion of the trench isolation region.

4. The solid-state image sensor of claim 1, wherein
a first width in a gate width direction of the photodiode region located under one end of the gate electrode is smaller than a second width in a longitudinal direction in a middle of the photodiode region.

5. The solid-state image sensor of claim 1, wherein
the photodiode region is formed by a p-n-p junction region, and the p-n-p junction region is formed by a first p-type region formed in the element formation region, an n-type region formed on the first p-type region, and a second p-type region formed on the n-type region.

6. The solid-state image sensor of claim 1, wherein
a gate width direction of the gate electrode is parallel to a longitudinal direction of the photodiode region.

7. The solid-state image sensor of claim 1, wherein
a gate width direction of the gate electrode is tilted with respect to a longitudinal direction of the photodiode region.

8. The solid-state image sensor of claim 7, wherein the gate width direction of the gate electrode is tilted at 45° with respect to the longitudinal direction of the photodiode region.

9. The solid-state image sensor of claim 1, wherein a control implantation layer is formed in a region located under the gate electrode, and surrounded by the photodiode region, the floating diffusion region, and the inactive layer.

10. The solid-state image sensor of claim 1, wherein a width of the element formation region under the gate electrode is smaller than 500 nm, and a control implantation layer is not formed in a region located under the gate electrode, and surrounded by the photodiode region, the floating diffusion region, and the inactive layer.

11. The solid-state image sensor of claim 1, wherein a region of the inactive layer located under the gate electrode has a peak concentration of $1.0 \times 10^{16}$ to $4.5 \times 10^{18}$ cm$^{-3}$.

12. The solid-state image sensor of claim 11, wherein the region of the inactive layer located under the gate electrode has a diffusion layer width of 10 nm to 250 mm.

* * * * *